United States Patent
Moon

Patent Number: 5,291,057
Date of Patent: Mar. 1, 1994

[54] RECTANGULAR SHAPED LASER DIODE AND SYMMETRICALLY INVERTED TRIANGULAR SHAPED EMITTING AND RECEIVING PHOTODIODES ON THE SAME SUBSTRATE

[75] Inventor: Seung H. Moon, Seoul, Rep. of Korea

[73] Assignee: Samsung Electronics Co., Ltd., Kyungki, Rep. of Korea

[21] Appl. No.: 788,617

[22] Filed: Nov. 6, 1991

[30] Foreign Application Priority Data

Jul. 20, 1991 [KR] Rep. of Korea ............... 91-12537

[51] Int. Cl.⁵ ............... H01L 27/14; H01L 31/00; H01L 29/161; H01S 3/19

[52] U.S. Cl. ............... 257/466; 257/80; 257/84; 257/93; 257/96; 257/97; 257/432; 257/522; 359/281; 359/282; 372/43; 372/45; 372/50

[58] Field of Search ............... 357/30 B, 16, 19, 30 E, 357/30 G, 30 D, 17; 372/8, 19, 45, 50; 257/80, 93, 95, 96, 432, 466, 522, 79, 81, 82, 84, 431, 432, 433; 359/281, 282, 283, 324, 488, 585

[56] References Cited

U.S. PATENT DOCUMENTS

| | | | |
|---|---|---|---|
| 4,570,172 | 2/1986 | Henry et al. | 357/17 |
| 4,675,518 | 6/1987 | Oimura et al. | 372/50 |
| 4,736,231 | 4/1988 | Ayabe et al. | 357/30 G |
| 4,941,146 | 7/1990 | Kobayashi | 357/16 |
| 4,989,214 | 1/1991 | Kwa | 372/50 |
| 5,032,879 | 7/1991 | Buchmann et al. | 357/16 |
| 5,091,757 | 2/1992 | Yoshida | 357/16 |

OTHER PUBLICATIONS

Anderson, G. W. et al. "High-Speed Planar GaAs Photoconductors with Surface Implant Layers," Appl. Phys. Lett. 53(4), Jul. 25, 1988, pp. 313–315.
IEEE Journal of Quantum Electronics, vol. 25, No. 11, of Nov. 1989.

*Primary Examiner*—Andrew J. James
*Assistant Examiner*—Alice W. Tang
*Attorney, Agent, or Firm*—Ladas & Parry

[57] ABSTRACT

A compound semiconductor device and a process for manufacturing it is disclosed. The process comprises the steps of forming a first conduction type first clad layer, a first conduction type or second conduction type activated layer, a second conduction type second clad layer, and a second conduction type cap layer upon a first conduction type semiconductor substrate, forming a first conduction type electrode and a second conduction type electrode, and forming a rectangular pole shaped laser diode, a triangular pole shaped detecting photo-diode, and a triangular pole shaped receiving photo-diode by carrying out a single round of anisotropic etching. According to the present invention, the high density can be easily realized, so that the power consumption and the manufacturing cost can be saved.

11 Claims, 1 Drawing Sheet

RECTANGULAR SHAPED LASER DIODE AND SYMMETRICALLY INVERTED TRIANGULAR SHAPED EMITTING AND RECEIVING PHOTODIODES ON THE SAME SUBSTRATE

FIELD OF THE INVENTION

The present invention relates to a compound semiconductor device and a process for manufacture thereof, and particularly to, a compound semiconductor and a process for manufacture thereof in which a laser diode and a photo-diode are formed on the same chip.

BACKGROUND OF THE INVENTION

Recently, in accordance with the rapid progress in the data communication techniques, the demands for ultra-high speed computers, ultra-high frequency, and optical communications have been steadily increasing. However, there is a limit in meeting such demands by means of the conventional silicon devices, and therefore, there have been brisk research activities on compound semiconductor devices made of materials having superior properties. Of the materials for such compound semiconductor devices, GaAs has a good electron mobility of about 8500 cm$^2$/V.S and is superior in its own noise characteristics, so that it can be used on high speed devices such as MESFET (Metal Semiconductor FET) and HEMT (High Electron Mobility Transistor). Further, GaAs has an energy band gap of about 1.43 eV at the normal temperature, and therefore, the wave length of light is about 8800 Å which is a wave length near infrared. Moreover, it has direct transition characteristics. Therefore, it can be used on laser diodes (to be called LD below) and on photo-diodes (to be called PD below).

The LD inductively releases light which is produced by the reunions of the holes and electrons which are injected from the PN junction of the semiconductor devices, and the released light has interferences and orientation characteristics. Meanwhile, the PD has the same structure as the LD, and an electric current flows through it when a reverse bias is applied and light rays are irradiated on it. Therefore, the LD and the PD are respectively used for transmitting and receiving in communication. Further, if the LD is used as a transmitting device, the intensity of the light rays released therefrom is made constant by using a monitoring PD (to be called MPD below). That is, the MPD detects the intensity of the light rays released from the LD, and controls the voltage which is supplied through an external circuit to the LD.

The LD and the MPD are combined by means of wires and bondings in the form of a hybrid, but their manufacturing cost is high, and there is a difference between the characteristics of the manufacturing processes of the LD and the MPD. Therefore, it is difficult to manufacture the MPD which has the same energy band gap as the wave length of the light rays released from the LD, and therefore, its optical detecting capability has been very low due to the non-linear optical receiving property. Therefore, research has been focused on how to form the LD and the MPD on the same chip.

FIG. 1 is a sectional view of conventional compound semiconductor device in which an LD and an MPD are formed on the same chip. The compound semiconductor device consists of the LD formed region L and the MPD formed region M, and the LD and the MPD have the same constitution. The LD is constituted such that a p-type Al$_x$Ga$_{1-y}$As clad layer 3, a p-type Al$_y$Ga$_{1-y}$As activated layer 5, an n-type Al$_x$Ga$_{1-x}$As clad layer 7, and an n-type GaAs cap layer 9 are formed on the region L of a p-type GaAs semiconductor substrate 1. The activated layer 5 is formed in the p-type, but it can be of n-type, while the composition ratio $1 \geq x \geq y \geq 0$ has to be satisfied in order for the activated layer 5 to have a refraction index larger than that of the clad layers 3,7. Further, an n-type electrode 11 is formed on the cap layer 9, and a p-type electrode 13 is formed at the bottom surface of semiconductor substrate 1.

Further, the MPD having the same constitution as that of the LD is formed in the region M of the semiconductor substrate 1, and therefore, the p-type electrode 13 serves as a common electrode. The MPD receives the light rays released from the light emitting face of the LD, and, when a reverse bias is applied, the released light rays separate the carriers into electrons and holes at the activated layers 5 of the MPD as a result of which a current flows between the n-type electrode 11 and the p-type electrode 13.

The amount of the current flow is proportionate to the intensity of the light rays released from the light emitting face of one side of the LD, and therefore, the intensity of the light rays is controlled through an external circuit in accordance with the amount of the current. In the above, the activated layers 5 of the LD and MPD have the same energy band gaps and are also in phase as the coupling efficiency is very high. Further, if the light rays released from the LD impinge on the LD after being reflected from the light receiving face of the MPD, then the SN ratio (signal-to-noise ratio) of the LD is aggravated, and therefore, the light receiving face of the MPD is inclined relatively to the substrate 1. Thus, the semiconductor substrate 1 is etched vertically in order to form the light emitting face of the LD, and the MPD is etched again in such a manner that the light receiving face of the MPD has a certain inclination angle relative to the light emitting face of the LD.

The above described compound semiconductor device is used as a transmitting device in communication systems, but it can be used also as a transmitting/receiving device by combining it with a receiving PD (to be called RPD below).

However, the above described compound semiconductor device requires two stages of etching in forming the light receiving face of the MPD, and therefore, its manufacturing process becomes complicated. Further, if the compound semiconductor device is used in a communication system, its combination with the RPD increases the power consumption and makes it difficult to achieve a high density, as well as increases the manufacturing cost.

SUMMARY OF THE INVENTION

Therefore it is a first object of the present invention to provide a compound semiconductor device in which the manufacturing process is simplified by forming the light receiving face of an MPD vertically relative to a horizontal semiconductor substrate.

It is a second object of the present invention to provide a compound semiconductor device in which an LD, an MPD and an RPD are formed on the same chip.

It is a third object of the present invention to provide a process for manufacturing the compound semiconductor device.

To achieve the first object of the present invention, the compound semiconductor device according to the present invention which is constituted such that a laser diode and a detecting photo-diode for controlling the intensity of the light rays through an external circuit by detecting the intensity of the light rays released from the laser diode are formed on the same semiconductor substrate is characterized in that; the light receiving face of the detecting photo-diode for receiving the light rays released from the laser diode is formed vertically relative to the horizontal semiconductor substrate i.e. perpendicular thereto and faces the light emitting face of the laser diode at a predetermined of inclination angle.

To achieve the second object of the present invention, the compound semiconductor device according to the present invention comprises a rectangular shaped laser diode, a triangular shaped detecting photo-diode of which one side is perpendicular to the semiconductor substrate and faces the light emitting face of the laser diode at such a predetermined angle that the reflected light to said one side can not impinge on the light emitting face of the laser diode, and the other side of the triangular detecting photodiode has a different angle then said predetermined angle, and a triangular shaped receiving photo-diode disposed symmetrically relative to the detecting photo-diode, and the above said diodes being formed on the same semiconductor substrate.

To achieve the third object of the present invention, the process for manufacturing the compound semiconductor device comprises the steps of epi-growing a first conduction type first clad layer, a first conduction type or a second conduction type activated layer, a second conduction type clad layer, and a second conduction type cap layer upon a first conduction type semiconductor substrate in sequence, forming a first conduction type electrode and a second conduction type electrode under the semiconductor substrate and upon the cap layer respectively, and forming a rectangular pole shaped laser diode and symmetrically disposed triangular pole shaped detecting and receiving photo-diodes by carrying out anisotropical etching in a single operation to a predetermined depth into the semiconductor substrate.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1:
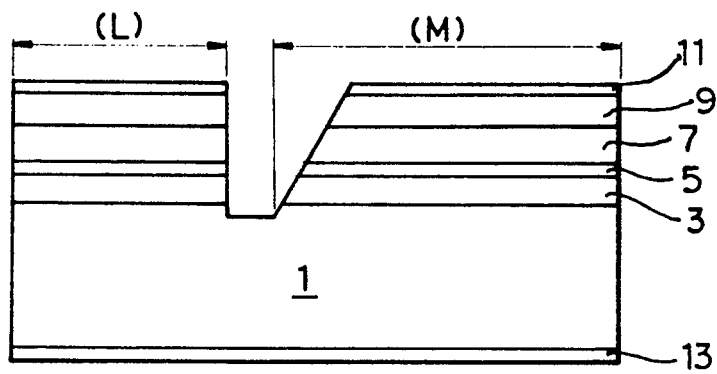
FIG. 1 is a sectional view of the conventional compound semiconductor device.
Figure 2:
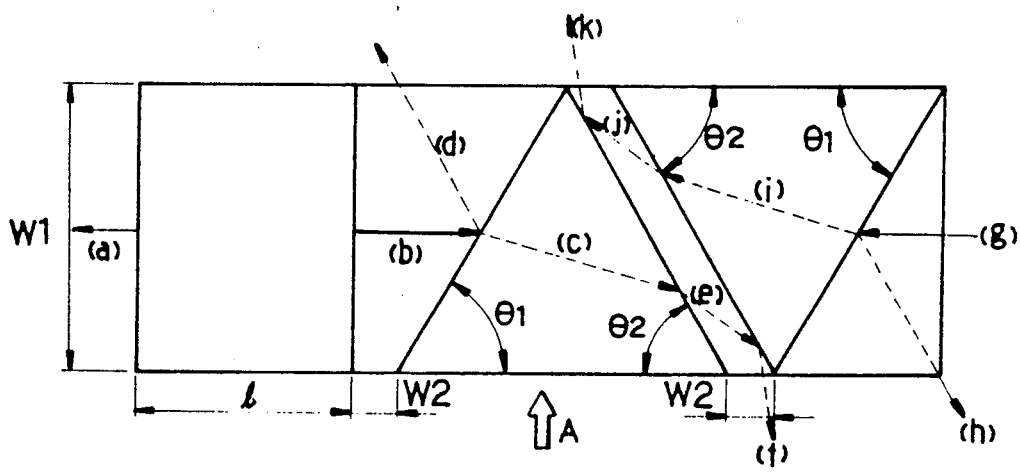
FIG. 2 is a plan view of a compound semiconductor device according to the present invention.
Figure 3:
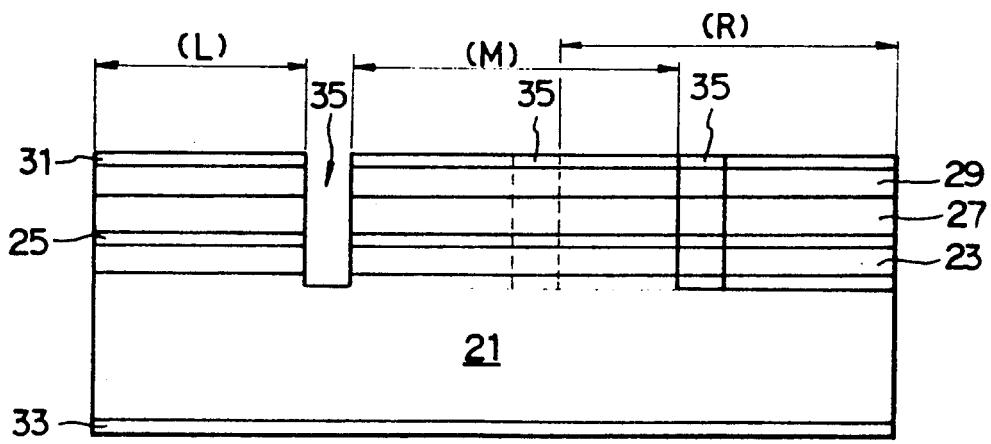
FIG. 3 is a side view of the device shown in FIG. 2.

FIG. 2 is a plan view of an embodiment for a compound semiconductor device according to the present invention, and FIG. 3 is a side view of the compound semiconductor device as shown in the direction of the arrow A in FIG. 2. The compound semiconductor device has an LD, an MPD and an RPD formed on the same chip thereof in such a manner that the LD is formed in a region L, the MPD in a region M, and the RPD in a region R. The LD, the MPD and the RPD are constituted such that, on a p-type GaAs semiconductor substrate 21, there are stacked a p-type $Al_xGa_{1-x}As$ first clad layer 23, a p-type $Al_yGa_{1-y}As$ activated layer 25, an n-type $Al_xGa_{1-x}As$ second clad layer 27, an n-type GaAs cap layer 29, and an n-type AuGe/Ni/Au electrode 31, with the LD, the MPD and the RPD being isolated from one another by isolating spaces or gaps 35. Further, a p-type AuZn/Au electrode 33 is formed under the semiconductor substrate 21.

In the above, the activated layer 25 is a p-type, but it can be formed as a n-type layer, while the composition ratio is determined based on the relation $1 \geq x \geq y > 0$ in order to make the refraction index of the activated layer 25 larger than that of the first and second clad layers 23, 27. Further, the LD is formed of a rectangular shape, and the MPD and the RPD are symmetrically formed of a triangular shape, while those elements are isolated from each other by the isolating spaces 35 which are formed vertically relative to the horizontal semiconductor i.e. perpendicularly thereto substrate. If the internal angles of the faces of the MPD as observed in the direction of the arrow A are designated by $\theta_1$ and $\theta_2$, then the internal angles of the faces of the RPD as observed in the opposite direction to that of the arrow A become also $\theta_1$ and $\theta_2$. If the width of the LD is designated by W1, and its length by l, then the total length of the semiconductor device $l_T$ can be defined as below.

$$1T = 1 + \frac{2W_1}{\tan\theta_1} + \frac{W_1}{\tan\theta_2} + 2W_2$$

In the above, W2 indicates the width of the isolating spaces 35 which are formed between the respective elements. In the above formula, the minimum angles $\theta_1$ and $\theta_2$ which do not produce inter-element influences can be obtained by the following formulas.

$$\theta_1 = \tan^1\left(\frac{W_2}{W_1} + \frac{4W_2^2}{W_1^2} + 3\right)$$

$$\theta_2 = \pi - \left(\theta_1 + \frac{ns}{nd}\sin\left(\frac{\pi}{2} - \theta_1\right) + \sin^{-1}(1)\right)$$

In the second equation above (for $\theta_2$), nd represents refractive indices of the activated layers 25, and ns represents refractive indices of the isolating spaces. Therefore, $\theta_1$ is governed by the width $W_1$ of the LD and the width $W_2$ of the isolating spaces 35, while $\theta_2$ is determined by the refractive indices of the activated layers 25 and the isolating spaces 35 and $\theta_1$, with $\theta_1$ and $\theta_2$ being angles of less than $\pi/2$ radians. During the operation of the semiconductor device, errors can be prevented by adjusting the angles $\theta_1$ and $\theta_2$. That is, during the operation of the LD, the transmitting light rays (a) are emitted from one of the light emitting faces, and light rays (b) are emitted from the other light emitting face in order to detect and adjust the intensities of the light rays (a). It should be assured that the light rays reflected from one face of the MPD or released therefrom should not have a lowered S/N ratio by being returned to the LD. If the angle $\theta_1$ is assumed to be 60°, then the light rays (b) released from the other face enter the one face of the MPD at an angle of 60°. Therefore, light rays (d) which are reflected from said one face are not returned.

The compound semiconductor device constituted as above will now be described as to its operations.

First, when a transmission is made by driving the LD, if a voltage is supplied to the n-type and p-type electrodes 31,33 of the LD, the holes and the electrons injected from the activated layers 25 are rejoined, thereby emitting light rays. These light rays are oscillated to be released through the light emitting faces of the LD in the form of light rays (a),(b). The light rays (a) which are released through one light emitting face are for transmitting, while the light rays (b) which are released through the other light emitting face are for detecting the intensity of the light rays (a) by entering the MPD. If the light rays (b) enter the MPD, light rays (c) are refracted, governed by the refractive index nd of the activated layer 25, and, if reverse biases are supplied with the n-type and p-type electrodes 31,33, separations into electrons and positive holes occur in the activated layer 25 of the MPD, thereby producing a current flow. The amount of this current flow is proportional to the intensity of the light rays (b) entering the MPD, and therefore, the intensity of the light rays (a) transmitted from the LD can be controlled through an external circuit. Further, when the light rays (b) enter through said one face of the MPD, a predetermined amount of light rays (c) are refracted. The one face of the MPD is formed vertically to the horizontal semiconductor substrate 21, but it is inclined by $90° - \theta_1$ relative to the other light emitting face of the LD, and therefore, the light rays (d) do not reenter the LD again.

Further, the tiny amount of the light rays (c) which are not separated from the light rays (d) in the MPD are released in the form of light rays (e) to enter the RPD, but they are totally reflected owing to the refractive index ns of the element isolating region 35 and the refractive index of the activated layer 25 of the RPD, so that they can not enter the RPD but are dispersed into the air in the form of light rays (f).

Meanwhile, when a receiving operation is carried out by driving the RPD, if light rays (g) enter and if a reverse bias is applied, separations into electrons and holes are made in the activated layer 25 as a result of which a current flows between the n-type and p-type electrodes 31,33. Under this condition, the light rays (g) are not wholly absorbed but a part of them are reflected in the form of light rays (h), while light rays (i) which are absorbed into the activated layer 25 are not wholly separated into electrons and holes, so that light rays (j) are released to the MPD. The light rays (j) have a small inclination angle relative to the associated face of the MPD and do not enter the MPD, but are wholly reflected as light rays (k) owing to the refractive index ns of the element isolating spaces 35 and the refractive index nd of the activated layer 25 of the MPD.

In the above compound semiconductor device the LD, the MPD and the RPD are formed on the same semiconductor substrate, but it is also possible only for the LD and the MPD can be formed.

The above described compound semiconductor device will now be described as to its formation process.

A p-type $Al_xGa_{1-x}As$ first clad layer 23, a p-type or an n-type $Al_yGa_{1-y}Ga$ activated layer 25, an n-type $Al_xGa_{1-x}As$ second clad layer 27, and an n-type GaAs cap layer 29 are sequentially formed on a p-type GaAs semiconductor substrate 21 by the LPE(Liquid Phase Epitaxy), MBE(Molecular Beam Epitaxy) or MOCVD(Metal Organic Chemical Vapor Deposition) method. Then, an n-type electrode 31 composed of AuGe/Ni/Au is formed on the cap layer 29, and a p-type electrode 33 composed of AuZn/Au is formed under the substrate 21.

Then a photo-mask pattern is formed on the surface of the n-type electrode 31, and then, the substrate 21 is etched to a certain depth by an anisotropic etching method such as ion beam etching, so that element isolating spaces 35 for defining the LD, the MPD and the RPD are formed with the photo-mask pattern the mask is then removed. In the above, the LD is of a rectangular shape, and the MPD and the RPD are of triangular shape and they are formed by a single etching process in such a manner that the MPD and the RPD are symmetrical. The facing surfaces of the LD and the MPD are disposed in planes perpendicular to the substrate and inclined with respect to one another while the facing surfaces of the MPD and RPD are disposed in parallel planes which are perpendicular to the substrate.

According to the present invention as described above, the respective layers are formed on the same semiconductor substrate, and a single stage of the anisoltropic etching is carried out to form the rectangular pole shaped LD and the triangular pole shaped symmetrical MPD and RPD by adjusting the angles $\theta_1$ and $\theta_2$. Therefore, according to the present invention, the realization of the high density becomes easy, and the power consumption and the manufacturing cost can be reduced. Further the photo-diodes which are formed vertically relative to the horizontal semiconductor substrate and inclined relative to the light emitting face of the laser diode can be formed by a single etching process, and therefore, the manufacturing process becomes simple. In the embodiment of the present invention, the device is based on GaAs, but it can be also applied to InP.

What is claimed is:

1. A compound semiconductor device comprising:
    a substrate,
    a laser diode on said substrate,
    a detecting photodiode on said substrate, said laser diode having a light emitting face disposed in a plane perpendicular to said substrate, said detecting photodiode having a light receiving face facing said light emitting face of said laser diode with clearance space therebetween, said light receiving face of said detecting photodiode being disposed in a plane perpendicular to said substrate and at an angle relative to the plane containing the light emitting face of the laser diode, and a receiving photodiode on said substrate adjacent to said detecting photodiode on a side thereof opposite said laser diode,
    said laser diode being of a rectangular shape on said substrate, said detecting photodiode and said receiving photodiode each being of triangular shape on said substrate and symmetrically inverted with respect to one another.

2. The compound semiconductor device as claimed in claim 1 wherein said angle is less than $\pi/2$ and greater than a minimum angle at which light rays released from said laser diode at a certain position and angle relative to the light receiving face of said detection photodiode will not be reflected onto said light emitting surface after reflection by said light receiving face of said detecting photodiode.

3. The compound semiconductor device as claimed in claim 2, wherein said clearance space has a determined value at one side of the semiconductor device and increases in value towards the other side of the semiconductor device by an amount which is a function of the angle of inclination of the plane containing the light receiving face relative to the plane containing the light emitting face.

4. The compound semiconductor device as claimed in claim 1, wherein said triangular shaped detecting and receiving photodiodes each has base angles which are unequal.

5. The compound semiconductor device as claimed in claim 1, wherein said receiving and detecting photodiodes have facing surfaces which are perpendicular to said substrate and separated by a clearance space of uniform width.

6. The compound semiconductor device as claimed in claim 5, wherein said receiving and detecting photodiodes have surfaces facing away from one another which are perpendicular to said substrate and parallel to one another.

7. A compound semiconducting device comprising a substrate, a rectangular shaped laser diode extending perpendicularly from said substrate, a triangular shaped detecting photodiode extending perpendicularly from said substrate in adjacent relation to said laser diode, said laser diode having a light emitting surface and said detecting photodiode having a reflective light receiving surface facing said light emitting surface of said laser diode, said light emitting surface and said light receiving surface being disposed in planes perpendicular to said substrate and at an angle relative to one another such that a summation light beam emitted from said laser diode will be at a certain position and angle relative to the light receiving surface of said detecting photodiode so that light reflected by said light receiving surface will not impinge on said light emitting surface, and a triangular shaped receiving photodiode extending perpendicularly from said substrate in adjacent relation to said detecting photodiode on a side thereof remote from said laser diode.

8. The compound semiconductor device as claimed in claim 7, wherein said triangular shaped detecting photodiode has base angles which are unequal.

9. The compound semiconductor device as claimed in claim 8, wherein said receiving photodiode has the same triangular shape as said detecting photodiode and is symmetrically inverted with respect thereto.

10. The compound semiconductor device as claimed in claim 9, wherein said receiving and detecting photodiodes have facing surfaces which are perpendicular to said substrate and separated by a clearance space of uniform width.

11. The compound semiconductor device as claimed in claim 10, wherein receiving and detecting photodiodes have surfaces facing away from one another which are perpendicular to said substrate and parallel to one another.

* * * * *